United States Patent
Lin et al.

(10) Patent No.: US 9,412,770 B2
(45) Date of Patent: Aug. 9, 2016

(54) PIXEL STRUCTURE OF DISPLAY PANEL

(71) Applicant: CHUNGHWA PICTURE TUBES, LTD., Taoyuan (TW)

(72) Inventors: Sheng-chia Lin, Taoyuan (TW); Kuei-jane Chiu, Neipu Township, Pingtung County (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 0 days.

(21) Appl. No.: 14/753,808

(22) Filed: Jun. 29, 2015

(65) Prior Publication Data

US 2015/0303224 A1  Oct. 22, 2015

Related U.S. Application Data

(62) Division of application No. 13/612,432, filed on Sep. 12, 2012, now Pat. No. 9,128,333.

(30) Foreign Application Priority Data

Jul. 4, 2012  (TW) .............................. 101124073 A

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/12* | (2006.01) |
| *G02F 1/1333* | (2006.01) |
| *G02F 1/1343* | (2006.01) |
| *H01L 49/02* | (2006.01) |
| *H01L 29/786* | (2006.01) |
| *G02F 1/1362* | (2006.01) |

(52) U.S. Cl.
CPC ....... *H01L 27/1255* (2013.01); *G02F 1/133345* (2013.01); *G02F 1/134309* (2013.01); *H01L 27/124* (2013.01); *H01L 28/60* (2013.01); *H01L 29/786* (2013.01); *G02F 1/136213* (2013.01); *G02F 2001/136218* (2013.01); *G02F 2201/40* (2013.01)

(58) Field of Classification Search
CPC ...................... G02F 1/133371; H01L 27/1255
USPC ........................................................ 257/59, 72
See application file for complete search history.

(56) References Cited

U.S. PATENT DOCUMENTS

| 2011/0079783 A1 | 4/2011 | Choi |
|---|---|---|
| 2011/0310341 A1 | 12/2011 | Kim et al. |

(Continued)

FOREIGN PATENT DOCUMENTS

| TW | I329929 B | 9/2010 |
|---|---|---|
| TW | 201133098 A1 | 10/2011 |

(Continued)

*Primary Examiner* — Hsin-Yi Hsieh
(74) *Attorney, Agent, or Firm* — Hauptman Ham, LLP

(57) ABSTRACT

The present invention provides a pixel structure of a display panel and a method for manufacturing the same. The pixel structure comprises a first pixel area and a second pixel area that are adjacent to each other. The first pixel area has a first transparent conductive layer disposed therein and the second pixel area has a second transparent conductive layer disposed therein. The first transparent conductive layer in the first pixel area and the second transparent conductive layer in the second pixel area are located at different heights. The pixel structure of the present invention can efficiently increase an aperture ratio for the pixels on the display panel.

2 Claims, 7 Drawing Sheets

(56) References Cited

U.S. PATENT DOCUMENTS

2012/0086881 A1* 4/2012 Kim .................. H01L 27/1288
                                                        349/46
2012/0241748 A1    9/2012 Fujii

FOREIGN PATENT DOCUMENTS

TW    201142778 A1    12/2011
WO    2011070944 A1    6/2011

* cited by examiner

PIXEL STRUCTURE OF DISPLAY PANEL

CROSS-REFERENCE TO RELATED APPLICATION

This application is a division of a U.S. patent application Ser. No. 13/612,432, filed on Sep. 12, 2012.

TECHNICAL FIELD OF THE INVENTION

The present invention relates to a pixel structure of a display panel and a manufacturing method thereof, and more particularly, to a pixel structure of a display panel and a method for manufacturing the same, which can increase an aperture ratio for the pixels on the display panel.

BACKGROUND OF THE INVENTION

Nowadays, as display resolution has increased continuously, it needs to reduce occupied areas of pixels for such an tendency. However, this may lead to a problem that the aperture ratio decreases. The decrease of aperture ratio will result in insufficient light transmission for the display panel or it has to increase backlight power. Therefore, how to increase the aperture ratio is quite important for high-resolution display products.

For the display panel production methods commonly used, it has a tendency to increase the number of photolithographic etching processes for increasing the aperture ratio. For example, traditional five photolithographic etching processes are increased to six or eight photolithographic etching processes. Among conventional skills, one is to conceal electrodes of a storage capacitor for increasing the aperture ratio. Generally, the storage capacitor is formed as long as a metal layer disposed in the pixel structure is overlapped with a small fraction of a pixel electrode and the metal layer and the pixel electrode are separated by an insulating layer. This metal layer is usually connected to a common electrode that provides a common voltage. For example, one approach is to arrange one electrode of the storage capacitor and a scan line (or a gate line) in the same layer and arrange the electrode below a data line (or a source line). Another approach also arranges one electrode of the storage capacitor to a position below the data line but this electrode is arranged in a layer different from that of the scan line. Such an electrode is also a common electrode. Said another approach can avoid signal interference between the scan line and the data line.

No matter what approach a person takes, there are following problems. The spacing between two adjacent pixel electrodes in pixel areas has to be greater than a predetermined distance. If the spacing between the two adjacent pixel electrodes is not larger than the predetermined distance, it is likely that a short circuit occurs and this may make the panel unable to display images normally. That is to say, the design in two adjacent pixel electrodes is still limited by manufacturing standards and the aperture ratio still cannot be efficiently increased as well.

SUMMARY OF THE INVENTION

An objective of the present invention is to provide a pixel structure of a display panel and a method for manufacturing the same, for increasing the aperture ratio for the pixels on the display panel.

To achieve the above objective, the present invention provides a method for manufacturing a pixel structure, said pixel structure comprising a first pixel area and a second pixel area that are adjacent to each other, the first pixel area and the second pixel area being separated into their own regions by at least one scan line and at least one source line, each of the first pixel area and the second pixel area having a thin-film transistor, the thin-film transistor having a first end electrically connected to the scan line, a second end electrically connected to the source line, and a third end, said manufacturing method comprising steps of: forming a first transparent conductive layer in the first pixel area, the first transparent conductive layer being electrically connected to the third end of the thin-film transistor in the first pixel area; forming a first separation layer covering the first pixel area and the second pixel area; forming a conductive layer on a border between the first pixel area and the second pixel area; forming a second separation layer covering the first pixel area and the second pixel area; forming a second transparent conductive layer in the second pixel area, the second transparent conductive layer being electrically connected to the third end of the thin-film transistor in the second pixel area; and removing the first separation layer and the second separation layer that are located above the first transparent conductive layer of the first pixel area, to expose the first transparent conductive layer.

In another aspect, the present invention provides a method for manufacturing a pixel structure, said pixel structure comprising a first pixel area and a second pixel area that are adjacent to each other, the first pixel area and the second pixel area being separated into their own regions by at least one scan line and at least one source line, each of the first pixel area and the second pixel area having a thin-film transistor, the thin-film transistor having a first end electrically connected to the scan line, a second end electrically connected to the source line, and a third end, said manufacturing method comprising steps of: forming a first transparent conductive layer in the first pixel area, the first transparent conductive layer being electrically connected to the third end of the thin-film transistor in the first pixel area; and forming a second transparent conductive layer in the second pixel area at a height different from that of the first transparent conductive layer, the second transparent conductive layer being electrically connected to the third end of the thin-film transistor in the second pixel area.

In still another aspect, the present invention provides a pixel structure of a display panel, said pixel structure comprising a first pixel area and a second pixel area that are adjacent to each other, the first pixel area and the second pixel area being separated into their own regions by at least one scan line and at least one source line, each of the first pixel area and the second pixel area having a thin-film transistor, the thin-film transistor having a first end electrically connected to the scan line, a second end electrically connected to the source line, and a third end, said pixel structure comprising: a first transparent conductive layer disposed in the first pixel area, the first transparent conductive layer being electrically connected to the third end of the thin-film transistor in the first pixel area; and a second transparent conductive layer disposed in the second pixel area, the second transparent conductive layer being electrically connected to the third end of the thin-film transistor in the second pixel area; wherein the first transparent conductive layer in the first pixel area and the second transparent conductive layer in the second pixel area are located at different heights.

In the present invention, the first transparent conductive layer and the second transparent conductive layer respectively in the first pixel area and the second pixel area that are adjacent to each other are located at different heights. Therefore, the horizontal spacing between the first transparent conductive layer and the second transparent conductive layer can be reduced as compared to a horizontal spacing required in manufacturing standards, thereby increasing the aperture ratio for the pixels on the display panel. Moreover, in one embodiment, the conductive layer is formed on the border between the first transparent conductive layer and the second transparent conductive layer. By a shielding effect, the conductive layer can make the voltage of one transparent conductive layer not affect the other. Furthermore, the storage capacitors for the pixel data can be formed between the conductive layer and the first transparent conductive layer, and between the conductive layer and the second transparent conductive layer. The capacitances of the storage capacitors can be altered by adjusting the thickness of the separation layers between the conductive layer and the transparent conductive layers.

BRIEF DESCRIPTION OF THE DRAWINGS

FIG. 1A is a schematic diagram showing a first photolithographic etching process in the present invention.

FIG. 1B is a schematic diagram showing a second photolithographic etching process in the present invention.

FIG. 1C is a schematic diagram showing a third photolithographic etching process in the present invention.

FIG. 1D is a schematic diagram showing a fourth photolithographic etching process in the present invention.

FIG. 1E is a schematic diagram showing a fifth photolithographic etching process in the present invention.

FIG. 1F is a schematic diagram showing a sixth photolithographic etching process in the present invention.

FIG. 1G is a schematic diagram showing a seventh photolithographic etching process in the present invention.

FIG. 1H is a schematic diagram showing a eighth photolithographic etching process in the present invention.

FIG. 1I is a schematic diagram showing a ninth photolithographic etching process in the present invention.

DETAILED DESCRIPTION OF THE INVENTION

The present invention pertains to a pixel structure of a display panel and a method for manufacturing the same, in which pixel electrodes in two adjacent pixel areas are arranged at different heights. It can be said that the two pixel electrodes are formed in different layers such that the horizontal spacing between the pixel electrodes of the two adjacent pixel areas can be reduced as compared to a horizontal spacing required in manufacturing standards. That is to say, the area occupied by the pixel electrode is enlarged in the present invention. Hence, the present invention can increase the aperture ratio efficiently. In another aspect of the present invention, a conductive layer (or a metal conductive layer) can be disposed on a border between the two adjacent pixel areas. The conductive layer can construct storage capacitors respectively with the two pixel electrodes in the adjacent pixel areas. By a shielding effect, the conductive layer can reduce the coupling caused between the two adjacent pixel electrodes. Accordingly, the present invention can increase stability of an image displaying device.

Figure 1B:
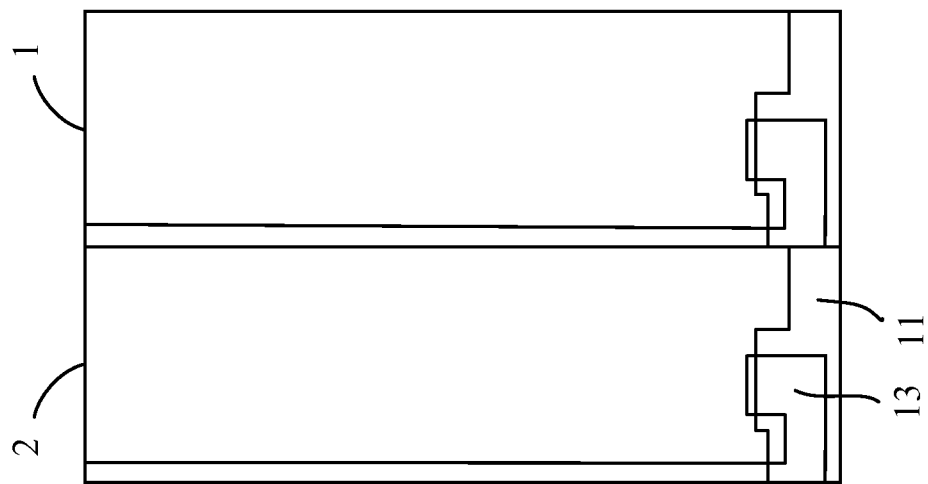
FIGS. 1A to 1I are schematic diagrams showing a method for manufacturing a pixel structure according to the present invention.
Figure 2:
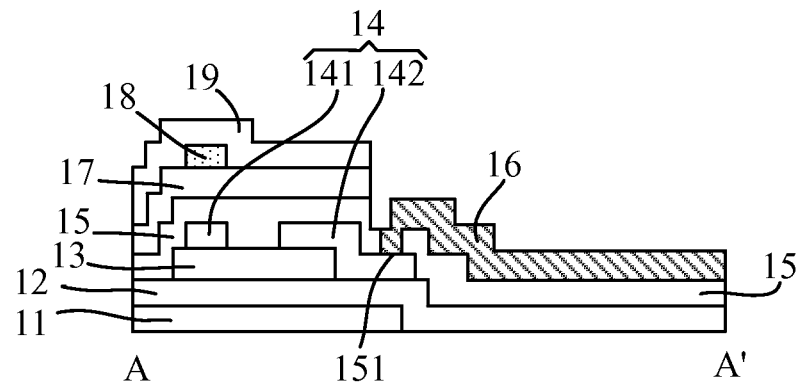
FIG. 2 is a cross-sectional view of a part drawn along A-A' in FIG. 1I.
Figure 3:
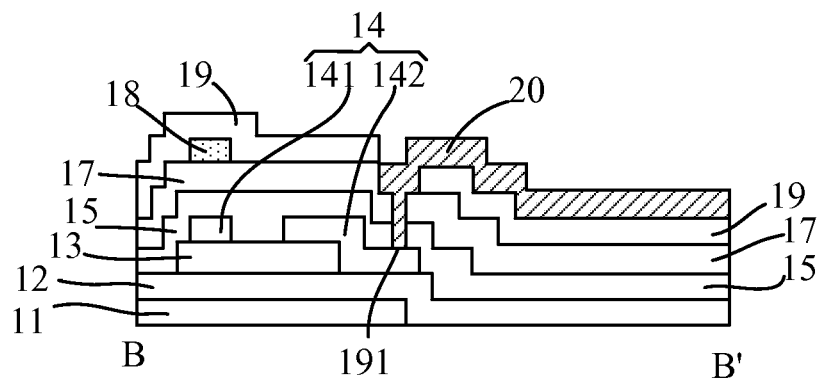
FIG. 3 is a cross-sectional view of a part drawn along B-B' in FIG. 1I.
Figure 4:
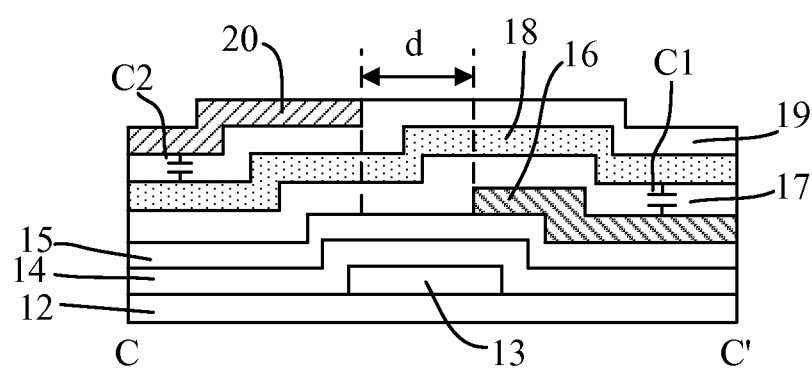
FIG. 4 is a cross-sectional view of a part drawn along C-C' in FIG. 1I.

FIGS. 1A to 1I are schematic diagrams showing a method for manufacturing a pixel structure according to the present invention. FIG. 2 is a cross-sectional view of a part drawn along A-A' in FIG. 1I. FIG. 3 is a cross-sectional view of a part drawn along B-B' in FIG. 1I. FIG. 4 is a cross-sectional view of a part drawn along C-C' in FIG. 1I.

In following descriptions, the present invention is illustrated by taking two adjacent pixel areas, i.e., a first pixel area 1 and a second pixel area 2, for example. The pixel areas mentioned in the present invention also can be sub pixel areas in the pixel areas, for example, red, blue, and green sub pixel areas. In the present invention, the pixels areas can be defined by interlaced scan lines (or called gate lines) and data lines (or called source lines). That is to say, the first pixel area 1 and the second pixel area 2 are separated into their own regions by the scan lines and the source lines. Moreover, in the illustrative embodiments of the present invention, each of the first pixel area 1 and the second pixel area 2 has a thin-film transistor. Each thin-film transistor has a first end, a second end, and a third end, which respectively can be a gate electrode, a source electrode, and a drain electrode. The first end of the thin-film transistor is electrically connected to the scan line, the second end of the thin-film transistor is electrically connected to the source line, and the third end of the thin-film transistor is electrically connected to the pixel electrode.

Figure 1A:

Please refer to FIG. 1A. First of all, a patterned first metal layer 11 is formed on a substrate by utilizing a first photolithographic etching process (PEP). The patterned first metal layer 11 comprises the gate electrode of the thin-film transistor. In this step, the patterned first metal layer 11 also may comprise the gate line. That is to say, the gate electrode of the thin-film transistor and the gate line are made of the same material and are formed in the same manufacturing step. A part of the gate line can be served as the gate electrode of the thin-film transistor. The gate electrode of thin-film transistor and the gate line substantially are electrically connected. The material of the patterned first metal layer 11 can be aluminum or any other conductive material. Specifically, a first metal layer is deposited on the substrate and then a patterned photoresist layer is formed on the first metal layer. After that, an etching process is performed to form the patterned first metal layer 11 as shown in FIG. 1A.

Next, a first insulating layer 12 is formed to cover the first pixel area 1 and the second first area 2 (see FIGS. 2 to 4).

Please refer to FIG. 1B. A patterned semi-conductive layer 13 is formed on the first insulating layer 12 by utilizing a second photolithographic etching process. The patterned semi-conductive layer 13 is also known as an active layer. The patterned semi-conductive layer 13 is arranged between the gate electrode, the source electrode, and the drain electrode of the thin-film transistor to be served as a semi-conductive channel. In the present embodiment, the patterned semi-conductive layer 13 extends to the region on where the source line is going to be formed in subsequent steps. However, in another embodiment, the patterned semi-conductive layer 13 may not have to extend to the region corresponding to the source line.

Figure 1D:
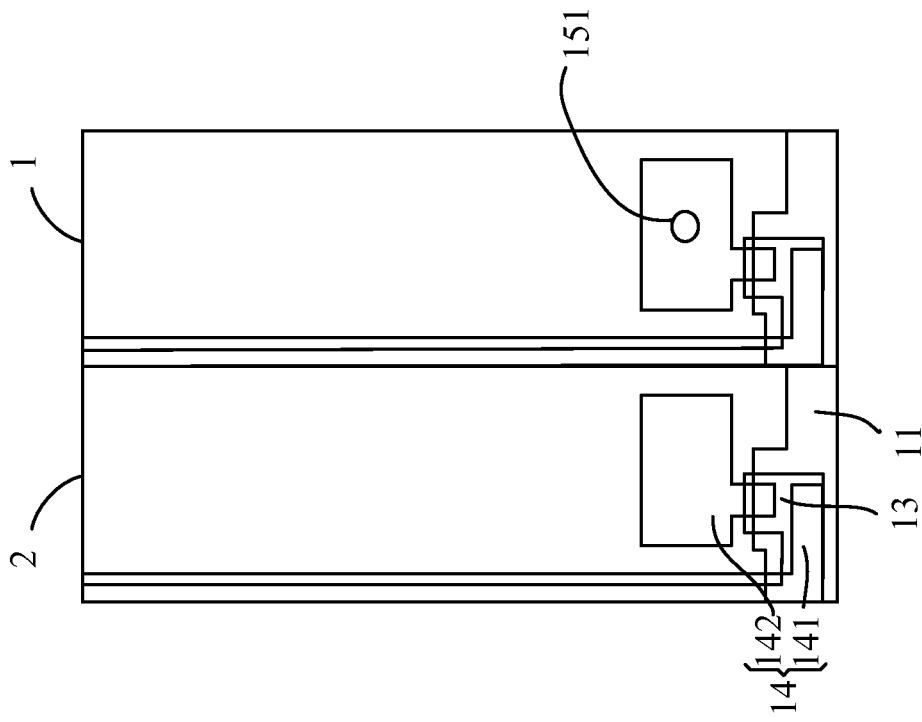
Figure 1C:
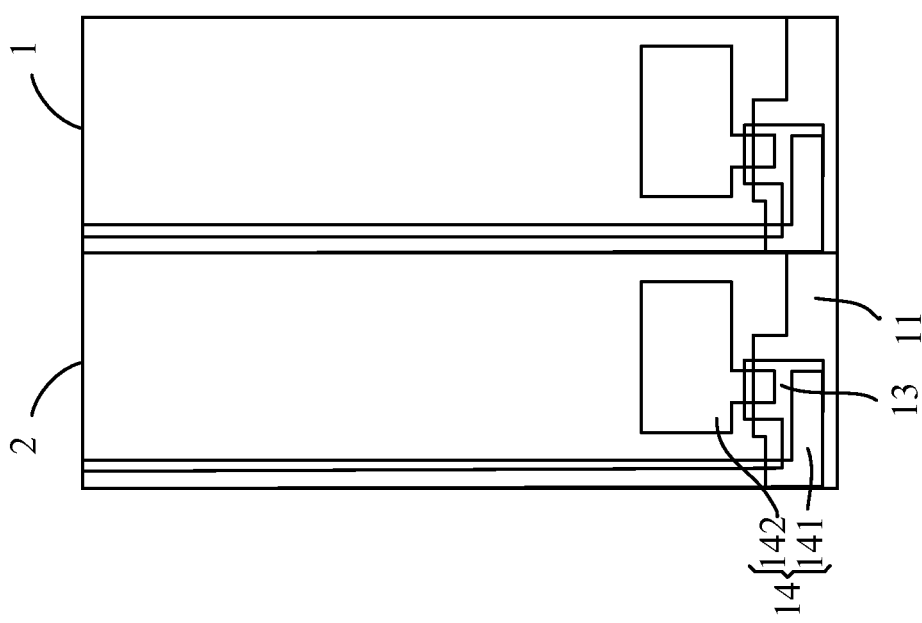

Please refer to FIG. 1C. A patterned second metal layer 14 is formed by utilizing a third photolithographic etching process. The patterned second metal layer 14 comprises the source electrode 141 and the drain electrode 142 of the thin-film transistor. In this step, the patterned second metal layer 14 also may comprise the source line. That is to say, the source electrode 141, the drain electrode 142, and the source line are made of the same material and are formed in the same manufacturing step. A part of the source line can be served as the source electrode 141 of the thin-film transistor. The source electrode 141 of thin-film transistor and the source line substantially are electrically connected. The material of the patterned second metal layer 14 can be a composite metal material such as Mo/Al/Mo, or any other appropriate single or composite material. Specifically, a second metal layer is deposited and then a patterned photoresist layer is formed on the second metal layer. After that, an etching process is performed to form the patterned second metal layer 14 as shown in FIG. 1C.

Next, a second insulating layer 15 is formed to cover the first pixel area 1 and the second pixel area 2 (see FIGS. 2 to 4).

Please refer to FIG. 1D. The second insulating layer 15 is perforated to form a first contact hole 151 in the first pixel area 1 by utilizing a fourth photolithographic etching process. The first contact hole 151 exposes the drain electrode 142 of the thin-film transistor in the first pixel area 1.

Figure 1E:
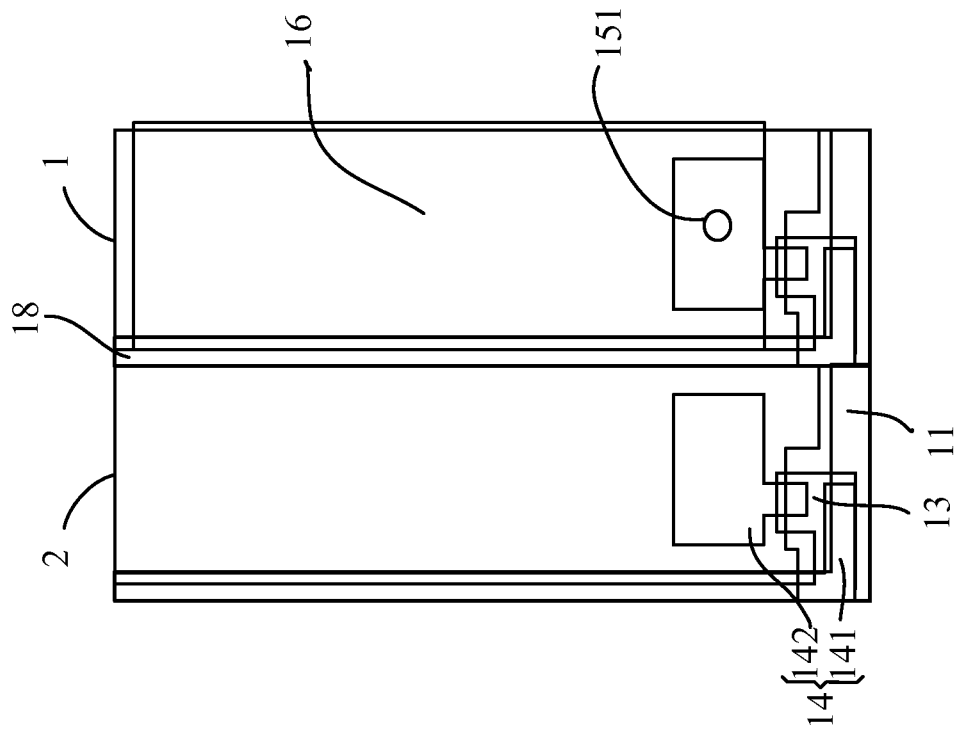

Please refer to FIG. 1E. By utilizing a fifth photolithographic etching process, a first transparent conductive layer 16, served as the pixel electrode of the first pixel area 1, is formed corresponding to the first pixel area 1. The first transparent conductive layer 16 is electrically connected to the drain electrode 142 of the thin-film transistor of the first pixel area 1 via the first contact hole 151. With the voltages provided by the drain electrode 142 of the thin-film transistor of the first pixel area 1, the first transparent conductive layer 16 can make liquid crystal molecules twisted. Specifically, a transparent conductive layer is coated to cover the first pixel area 1 and the second pixel area 2 and then the transparent conductive layer corresponding to the second pixel area 2 is etched away. Only the transparent conductive layer corresponding to the first pixel area 1 remains. Hence, the first transparent conductive layer 16 is formed.

Next, a first separation layer 17 is formed to cover the first pixel area 1 and the second first area 2 (see FIGS. 3 and 4).

Figure 1F:
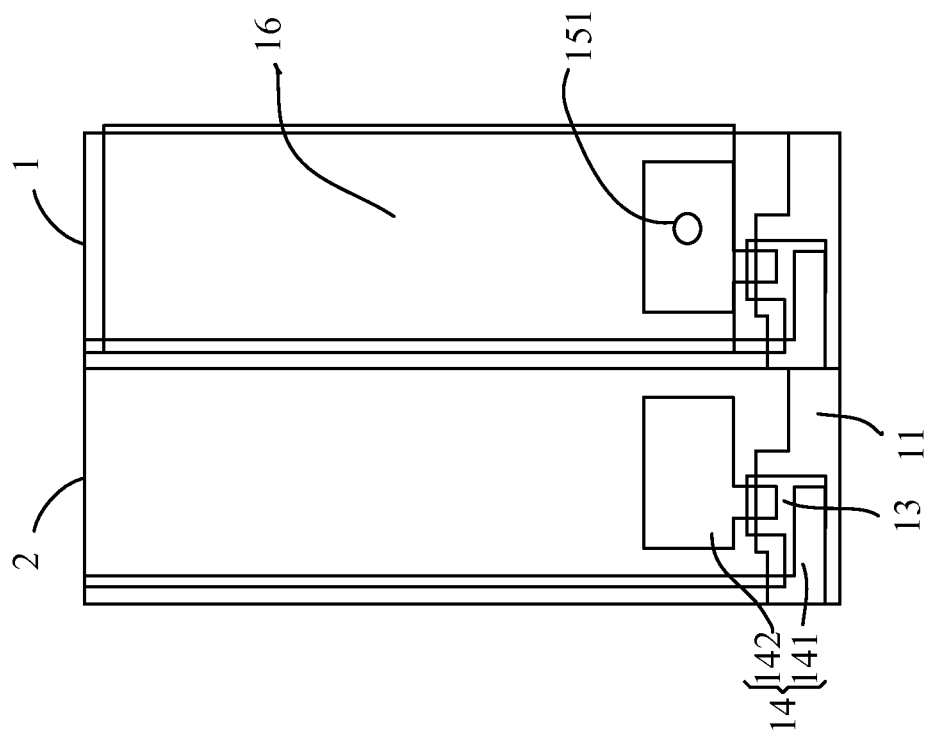

Please refer to FIG. 1F. By utilizing a sixth photolithographic etching process, a conductive layer 18 (or a metal conductive layer) is formed on the border between the first pixel area 1 and the second pixel area 2. A part of the first transparent conductive layer 16 is located right below the conductive layer 18 and a part of the second transparent conductive layer 20 that is going to be formed in subsequent steps is located right above the conductive layer 18. In addition, the conductive layer 18 may extend to a region above the gate line or over a side of the gate line for receiving a common voltage provided by a common electrode.

Next, a second separation layer 19 is formed to cover the first pixel area 1 and the second first area 2 (see FIGS. 3 and 4).

Figure 1G:
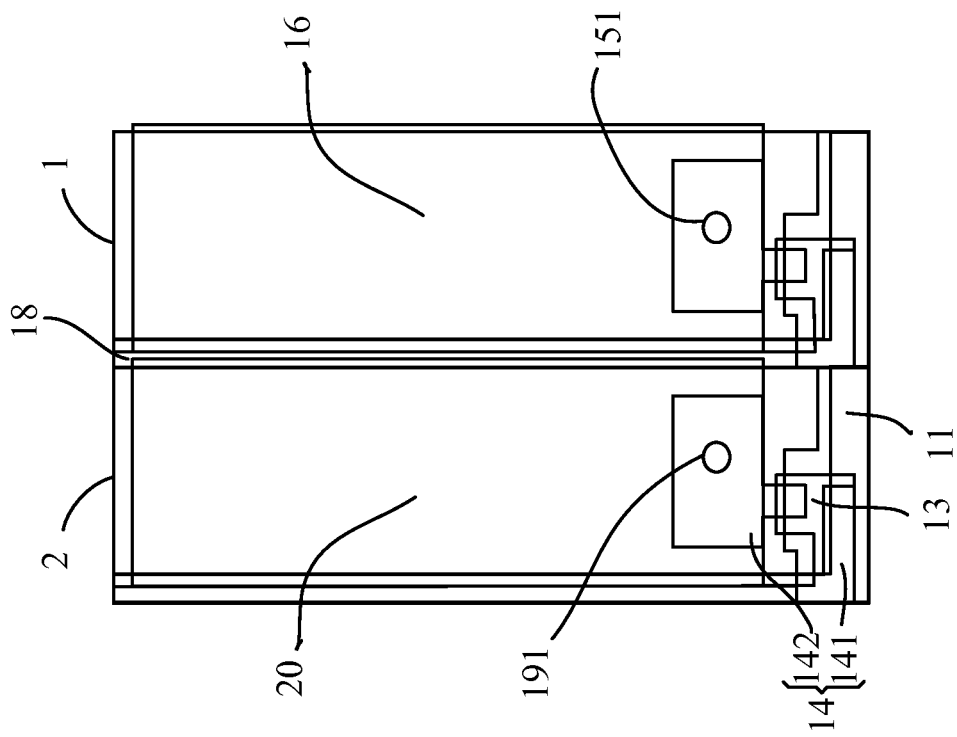

Please refer to FIG. 1G. The second insulating layer 15, the first separation layer 17, and the second separation layer 19 are perforated to form a second contact hole 191 in the second pixel area 2 by utilizing a seventh photolithographic etching process. The second contact hole 191 exposes the drain electrode 142 of the thin-film transistor in the second pixel area 2.

Figure 1H:
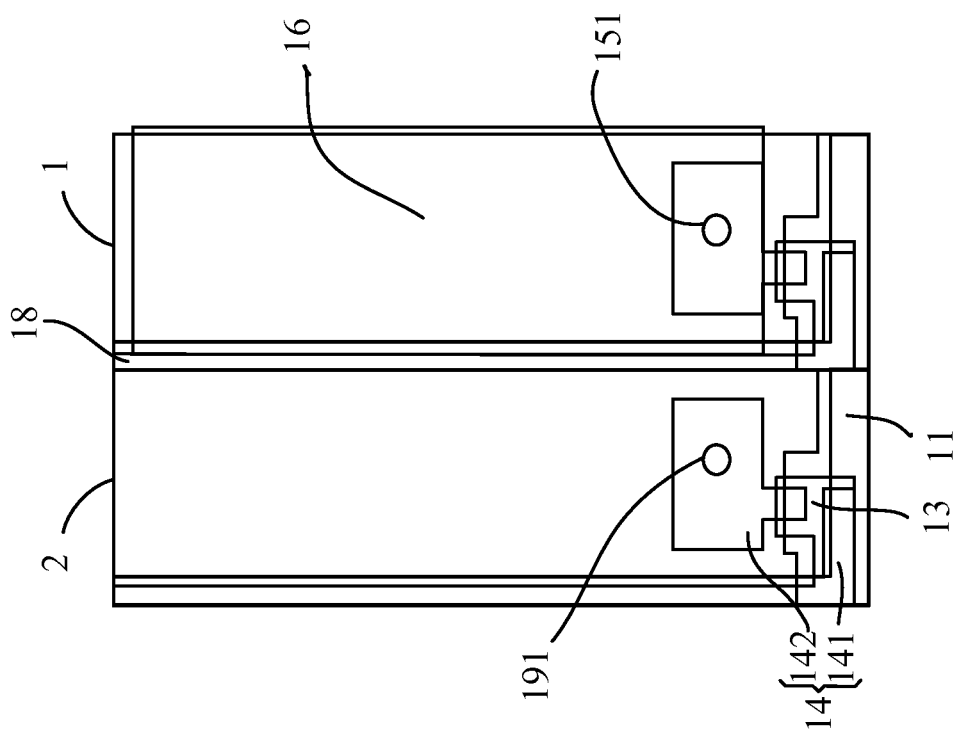

Please refer to FIG. 1H. By utilizing a eighth photolithographic etching process, a second transparent conductive layer 20, served as the pixel electrode of the second pixel area 2, is formed corresponding to the second pixel area 2. The second transparent conductive layer 20 is electrically connected to the drain electrode 142 of the thin-film transistor of the second pixel area 2 via the second contact hole 191. With the voltages provided by the drain electrode 142 of the thin-film transistor of the second pixel area 2, the second transparent conductive layer 20 can make the liquid crystal molecules twisted. The material of the first transparent conductive layer 16 and the second transparent conductive layer 20 can be an indium tin oxide (ITO). The way to fabricate the second transparent conductive layer 20 is similar to that of the first transparent conductive layer 16. Hence, this is omitted for simplicity.

Figure 1I:
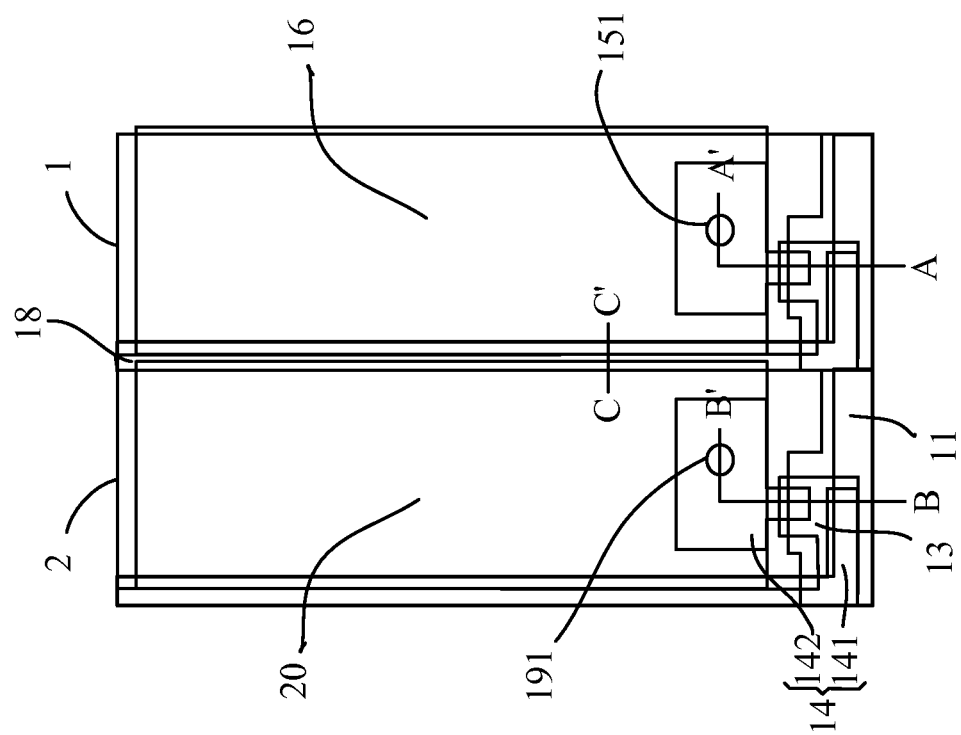

Please refer to FIG. 1I. Finally, by utilizing a ninth photolithographic etching process, the first separation layer 17 and the second separation layer 19 that are located above the first transparent conductive layer 16 of the first pixel area 1 are removed so as to expose the first transparent conductive layer 16.

As shown in FIG. 4, the pixel structure of the present invention comprises the first pixel area 1 and the second pixel area 2 that are adjacent to each other. The first transparent conductive layer 16 in the first pixel area 1 and the second transparent conductive layer 20 in the second pixel area 2 are located at different heights. Specifically, the first transparent conductive layer 16 and the second transparent conductive layer 20 are arranged in different layers and are formed in different manufacturing steps. Therefore, the horizontal spacing d between the first transparent conductive layer 16 and the second transparent conductive layer 20 can be reduced. In the case of arranging two transparent conductive layers of adjacent pixel areas in the same layer, conventional manufacturing standards require that the horizontal spacing between the two transparent conductive layers should be greater than 6 µm. Or else, the voltage of one transparent conductive layer will affect the other, and this may affect displaying images. In the present invention, the first transparent conductive layer 16 and the second transparent conductive layer 20 are located at different heights. Accordingly, the horizontal spacing between the two can be decreased. For example, the horizontal spacing can be reduced to 3 µm. The areas occupied by the first transparent conductive layer 16 and the second transparent conductive layer 20 are enlarged. Therefore, the present invention can efficiently increase the aperture ratio for the pixels on the display panel.

As shown in FIG. 4, the conductive layer 18 is formed on the border between the first pixel area 1 and the second pixel area 2. A part of the first transparent conductive layer 16 of the first pixel area 1 is formed below the conductive layer 18 and a part of the second transparent conductive layer 20 of the second pixel area 2 is formed above the conductive layer 18. The part of the first transparent conductive layer 16, the conductive layer 18, and the part of the second transparent conductive layer 20 are separated respectively by the first separation layer 17 and the second separation layer 19. By a shielding effect, the conductive layer 18 can reduce the coupling that may be caused between the first transparent conductive layer 16 and the second transparent conductive layer 20, thereby increasing stability of an image displaying device. In addition, if the conductive layer 18 is a metal conductive layer, the shielding effect it takes may be better.

Moreover, the part of the first transparent conductive layer 16 of the first pixel area 1 is arranged right below the conductive layer 18 and they are separated by the first separation layer 17 such that a first storage capacitor C1 may be constructed between the conductive layer 18 and the first transparent conductive layer 16; the part of the second transparent conductive layer 20 of the second pixel area 2 is arranged right above the conductive layer 18 and they are separated by the second separation layer 19 such that a second storage capacitor C2 may be constructed between the conductive layer 18 and the second transparent conductive layer 20. The capacitances of the first storage capacitor C1 and the second storage capacitor C2 can be altered not only by adjusting the occupied areas, but also by adjusting the thickness of the first separation layer 17 and the second separation layer 19. In one embodiment, the first separation layer 17 and the second separation layer 19 have the same thickness, and the capacitance of the first storage capacitor C1 is equal to that of the second storage capacitor C2. In another embodiment, an implementation for making the first storage capacitor C1 and the second storage capacitor C2 have different capacitances is to make the first separation layer 17 and the second separation layer 19 have different thickness. For example, the storage capacitance will be decreased when the thickness of the separation layer is increased.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A pixel structure of a display panel, said pixel structure comprising a first pixel area and a second pixel area that are adjacent to each other, the first pixel area and the second pixel area being separated into their own regions by at least one scan line and at least one source line, each of the first pixel area and the second pixel area having a thin-film transistor, the thin-film transistor of the each of the first pixel area and the second pixel area having a first end electrically connected to the scan line, a second end electrically connected to the source line, and a third end, said pixel structure comprising:

a first transparent conductive layer disposed in the first pixel area, the first transparent conductive layer being electrically connected to the third end of the thin-film transistor in the first pixel area;

a second transparent conductive layer disposed in the second pixel area, the second transparent conductive layer being electrically connected to the third end of the thin-film transistor in the second pixel area;

a conductive layer disposed at a border between the first pixel area and the second pixel area, a part of the first transparent conductive layer being formed right below the conductive layer and a part of the second transparent conductive layer being formed right above the conductive layer in a vertical direction perpendicular to a bottommost surface of the pixel structure, the first transparent conductive layer does not overlap the second transparent conductive layer in the vertical direction;

a first separation layer for separating the conductive layer and the part of the first transparent conductive layer such that the conductive layer and the part of the first transparent conductive layer construct a first storage capacitor; and a second separation layer for separating the conductive layer and the part of the second transparent conductive layer such that the conductive layer and the part of the second transparent conductive layer construct a second storage capacitor; wherein the first transparent conductive layer in the first pixel area and the second transparent conductive layer in the second pixel area are located at different heights.

2. The pixel structure according to claim 1, wherein the first transparent conductive layer in the first pixel area is electrically connected to the third end of the thin-film transistor of the first pixel area via a first contact hole; the second transparent conductive layer in the second pixel area is electrically connected to the third end of the thin-film transistor of the second pixel area via a second contact hole.

* * * * *